United States Patent [19]

Tamura

[11] Patent Number: 5,012,656
[45] Date of Patent: May 7, 1991

[54] HEAT SINK FOR A CONTROL DEVICE IN AN AUTOMOBILE AIR CONDITIONING SYSTEM

[75] Inventor: Yasuji Tamura, Ojima, Japan
[73] Assignee: Sanden Corporation, Gunma, Japan
[21] Appl. No.: 488,106
[22] Filed: Mar. 5, 1990

[30] Foreign Application Priority Data

Mar. 3, 1989 [JP] Japan .................................. 1-50098

[51] Int. Cl.⁵ .............................................. F25D 29/00
[52] U.S. Cl. ..................................... 62/498; 165/80.2; 357/82; 361/388
[58] Field of Search ......................... 62/113, 513, 493; 165/80.2–80.4; 357/81, 82; 361/381, 382, 385, 386, 388, 389

[56] References Cited

U.S. PATENT DOCUMENTS

| | | | |
|---|---|---|---|
| 2,966,033 | 12/1960 | Hughel | 165/80.4 X |
| 3,334,684 | 8/1967 | Roush et al. | 165/80.4 X |
| 4,326,386 | 4/1982 | Tamura | 62/150 |
| 4,546,619 | 10/1985 | Rohner | 165/80.4 X |
| 4,616,693 | 10/1986 | Dietzsch et al. | 165/80.3 X |
| 4,697,427 | 10/1987 | Niggemann et al. | 361/385 X |
| 4,720,981 | 1/1988 | Helt et al. | 62/113 |
| 4,815,658 | 3/1989 | Hidemitsu et al. | 237/2 A |
| 4,832,258 | 5/1989 | Hoshino et al. | 236/13 |

*Primary Examiner*—William E. Tapolcai
*Attorney, Agent, or Firm*—Banner, Birch, McKie & Beckett

[57] ABSTRACT

The present invention is directed to a heat sink for a control device in an electric circuit of an automobile air conditioning system. The control device includes a power transistor which varies the amount of electric power supplied to a motor, so as to vary the rotational speed of the motor in response to demand. The motor drives a compressor of a refrigerant circuit in order to change the driving condition of the compressor in response to change in the rotational speed thereof. The power transistor is fixedly attached to an exterior surface of an evaporator which is the coolest element of the refrigerant circuit in order to provide cooling therefor. Thus, an excessive rise in temperature of the power transistor is prevented without impeding the flow of air in a duct which conducts air from the evaporator to a passenger compartment and without complicating the process of assembling the refrigerant circuit of the automobile air conditioning system.

5 Claims, 4 Drawing Sheets

HEAT SINK FOR A CONTROL DEVICE IN AN AUTOMOBILE AIR CONDITIONING SYSTEM

BACKGROUND OF THE INVENTION

1. Field of the Invention

The present invention generally relates to a heat sink for a control device in an automobile air conditioning system, and more particularly, to the positioning of a control device on the evaporator of an air conditioning refrigerant circuit so that heat is effectively transferred from the control device without impeding the flow of air through a duct which connects the evaporator to the automobile passenger compartment.

2. Description of the Prior Art

In general, an automobile air conditioning system includes a refrigerant circuit and an electric circuit comprising electric devices for operating various elements of the refrigerant circuit. For example, a condenser fan motor operates in conjunction with a condenser of the refrigerant circuit, and a control apparatus which includes a control device, such as a power transistor, which is included with the electric circuit, which controls the operational condition of the condenser fan motor. Electric control devices likewise control various other electric devices which operate various refrigerant elements of the refrigerant circuit. However, heat generated in the control device during operation may damage the control device thereby detrimentally affecting control of the air conditioning system. Therefore, the control device must be cooled during operation of the air conditioning system to prevent thermal damage.

FIG. 1 shows a portion of a conventional automobile air conditioning system. Referring to FIG. 1, power transistor 100 is the control device of an electric control circuit. Power transistor 100 is mounted on a heat sink which includes a plurality of radiating plates 110 firmly secured to a top surface thereof, and is firmly attached to an inner surface of cover member 120 by a pair of screws 121. Cooling unit 50 comprises an evaporator (not shown) and casing 500 which is air tight and surrounds the evaporator while allowing air to pass through a heat exchanging portion of the evaporator. Casing 500 comprises two openings (only opening 501 is shown) opposing each other. Opening 501 of cooling unit 50 is opened to the outside, and the other opening is air tight and connected to one end (not shown) of duct 130. Duct 130 comprises opening 131 formed at a side surface thereof adjacent cooling unit 50. Opening 131 is adapted to accommodate power transistor 100 and its associated heat sink in duct 130. Cover member 131 forms an airtight seal around opening 131 by using a plurality of screws 132.

In operation, the air outside cooling unit 50 is conducted into cooling unit 50 through opening 501 by operation of an evaporator fan (not shown) as depicted by arrow "A". The air in cooling unit 50 is cooled while passing through a heat exchanging portion of the evaporator. The cooled air subsequently flows into duct 130 through the opening of casing 500, opposite the air inlet, to be conducted into the passenger compartment of an automobile as depicted by arrow "B". In this arrangement, a part of the cooled air in duct 130 is heat exchanged with plates 110 so as to prevent an excessive rise in the temperature of power transistor 100. Thus, thermal damage to power transistor 100 (the control device) is prevented and control of the air conditioning system is not detrimentally affected.

However, in certain conventional automobile air conditioning systems, where electric devices are used which consume large amounts of electric power, the amount of heat generated in power transistor 100 is increased. Therefore, radiating plates 110 on the heat sink associated with power transistor 100 must have increased dimensions in order to prevent an excessive rise in the temperature of power transistor 100. The result is that air in duct 130 is not able to flow smoothly due to interference with both power transistor 100 and plates 110. Therefore, the evaporator fan wastefully consumes electric power in order to compensate for the interference with the flow of air in duct 130 caused by power transistor 100 and plates 110.

FIG. 2 shows a block diagram of a refrigerant circuit of an automobile air conditioning system. Referring to FIG. 2, refrigerant circuit 200 includes compressor 210, condenser 220, receiver-drier 230, thermostatic expansion valve 240 and evaporator 250 serially connected through pipe members 270. Cooling device 260 is disposed between evaporator 250 and compressor 210 through pipe members 270. Cooling device 260 has a power transistor incorporated therein, as the control device, of an electric control circuit for the automobile air conditioning system. The throttling condition of expansion valve 240 is varied in response to the temperature at an outlet of evaporator 250, located upstream with respect to cooling device 260, in order to maintain super heat at the outlet of evaporator 250 at a proper temperature. In this construction, the power transistor is cooled by virtue of heat exchange between the suction refrigerant gas flowing through cooling device 260 in order to prevent the excessive rise in temperature of the power transistor. In this way, thermal damage to the power transistor (the control device) is prevented.

However, in this automobile air conditioning system, further hermetic joints are required in the refrigerant circuit in order to dispose cooling device 260 between evaporator 250 and compressor 210. Therefore, the process of assembling the refrigerant circuit becomes more complicated.

SUMMARY OF THE INVENTION

Accordingly, it is an object to the present invention to provide an automobile air conditioning system in which thermal damage to a control device of an electric control circuit which effects control of the air conditioning system is prevented without impeding the flow of air in a duct conducting the air from an evaporator to a passenger compartment.

It is another object of the present invention to provide an automobile air conditioning system in which, the thermal damage to a control device of a control circuit which effects control of the air conditioning system is prevented, while at the same time not complicating the process of assembling a refrigerant circuit therefor.

A control apparatus for an electric circuit of an automobile air conditioning system comprises at least one control device. The automobile air conditioning system comprises a refrigerant circuit which includes a compressor, a condenser, an expansion device and an evaporator. The electric circuit associated therewith comprises at least one electric device which operates at least one of the elements of the refrigerant circuit. The at least one control device is fixedly attached to an exterior surface of the evaporator so as to conduct heat generated in the control device to the exterior surface of the evaporator.

DETAILED DESCRIPTION

Figure 3:
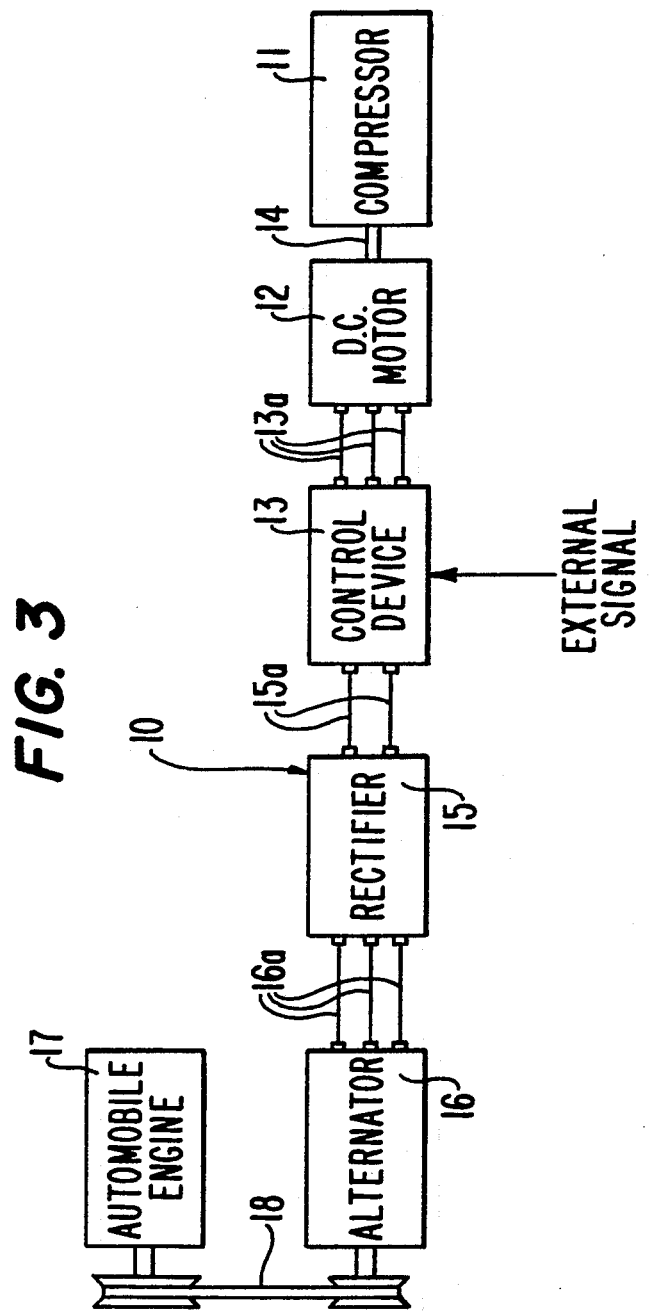
FIG. 3 is a schematic block diagram of a compressor driving unit used for an automobile air conditioning system in accordance with one embodiment of the present invention.
Figure 4:
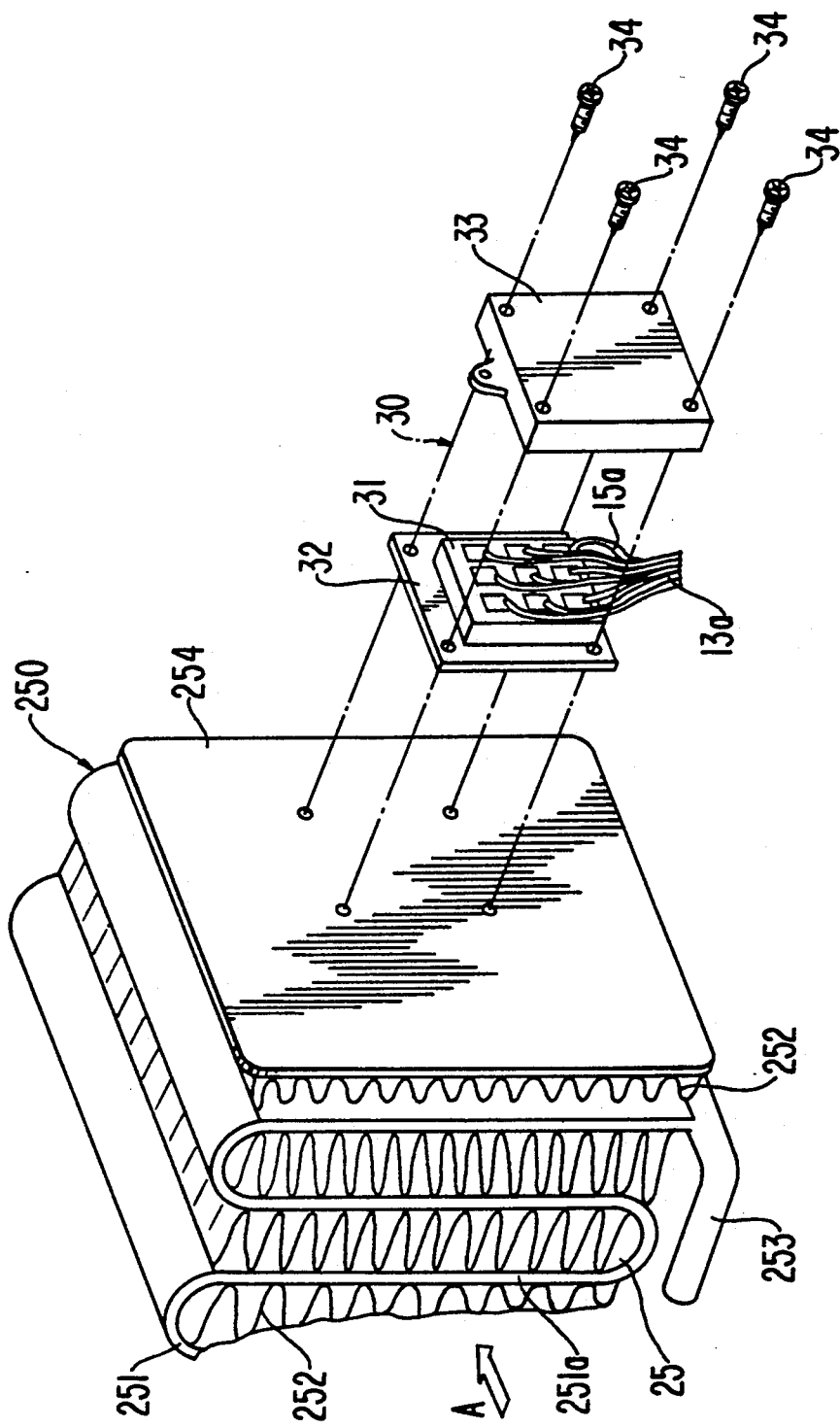
FIG. 4 is a perspective view of a power transistor unit and a part of an evaporator of the automobile air conditioning system in accordance with one embodiment of the present invention.

FIG. 3 shows a schematic block diagram of a compressor driving unit used for an automobile air conditioning system in accordance with one embodiment of the present invention. Referring to FIG. 3, compressor driving unit 10 includes compressor 11, DC motor 12 and control device 13 controlling the rotational speed of DC motor 12 in response to an external signal, for example, the temperature of air in the passenger compartment. Rotational motion of DC motor 12 is transmitted to compressor 11 through coupling device 14 in order to drive compressor 11. Control device 13 includes power transistor 31, as shown in FIG. 4, to vary the amount of electric power applied to DC motor 12. Automobile engine 17 is coupled to alternator 16 through a belt 18 which drives alternator 16 thereby producing alternating current at the output of alternator 16. The alternating current from alternator 16 is supplied to rectifier 15 through wires 16a, and is rectified to provide direct current at the output of rectifier 15. The direct current from rectifier 15 is supplied to control device 13 through wires 15a, and the valvue thereof is varied in response to an external signal. Electric power from control device 13 is supplied to DC motor 12 through wires 13a, and the rotational speed of DC motor 12 is varied in response to changes in the amount of electric power applied thereto. The rotational energy of DC motor 12, having various speeds, is transmitted to compressor 11 through coupling device 14 in order to drive compressor 11 with the various operational conditions. The refrigerant gas is compressed by compressor 11, and is discharged to a condenser (not shown), and then sequentially flows to a receiver-drier (not shown), a thermostatic expansion valve (not shown) and evaporator 250, as shown in FIG. 4, with a change in the phase thereof.

FIG. 4 shows a power transistor unit 30 and a part of an evaporator 250 of the automobile air conditioning system in accordance with one embodiment of the present invention. Referring to FIG. 4 in addition to FIG. 3, evaporator 250 includes, a serpentine-shape flat tube 251 comprising a plurality of straight portions 251a and plurality of corrugated fins 252 fixedly attached to and sandwiched by opposing straight portions 251a of serpentine-shaped flat tube 251. The Serpentine-shaped flat tube 251 and corrugated fins 252 jointly form heat exchange portion 25. The serpentine-shaped flat tube 251 is provided with an outlet pipe 253 at one end thereof so as to conduct the refrigerant gas into the inlet port of compressor 11. A pair of protective plates 254 (only one is shown) are securely joined to the outermost straight portions of flat tube 251 through corrugated fins 252.

Power transistor unit 30 includes a conduction plate 32, power transistor 31 fixedly attached to the conduction plate 32 by using screws (not shown), and cover 33 for protecting the power transistor 31. Conduction plate 32 and cover 33 are fixedly secured to the protective plate 254 of evaporator 250 by using a plurality of screws 34 so as to make contact between the conduction plate 32 and an exterior surface of protective plate 254. Wires 15a and 13a connect power transistor 31 to rectifier 15 and motor 12, respectively. Wires 13a supply electric power having a variable value to DC motor 12.

Figure 1:
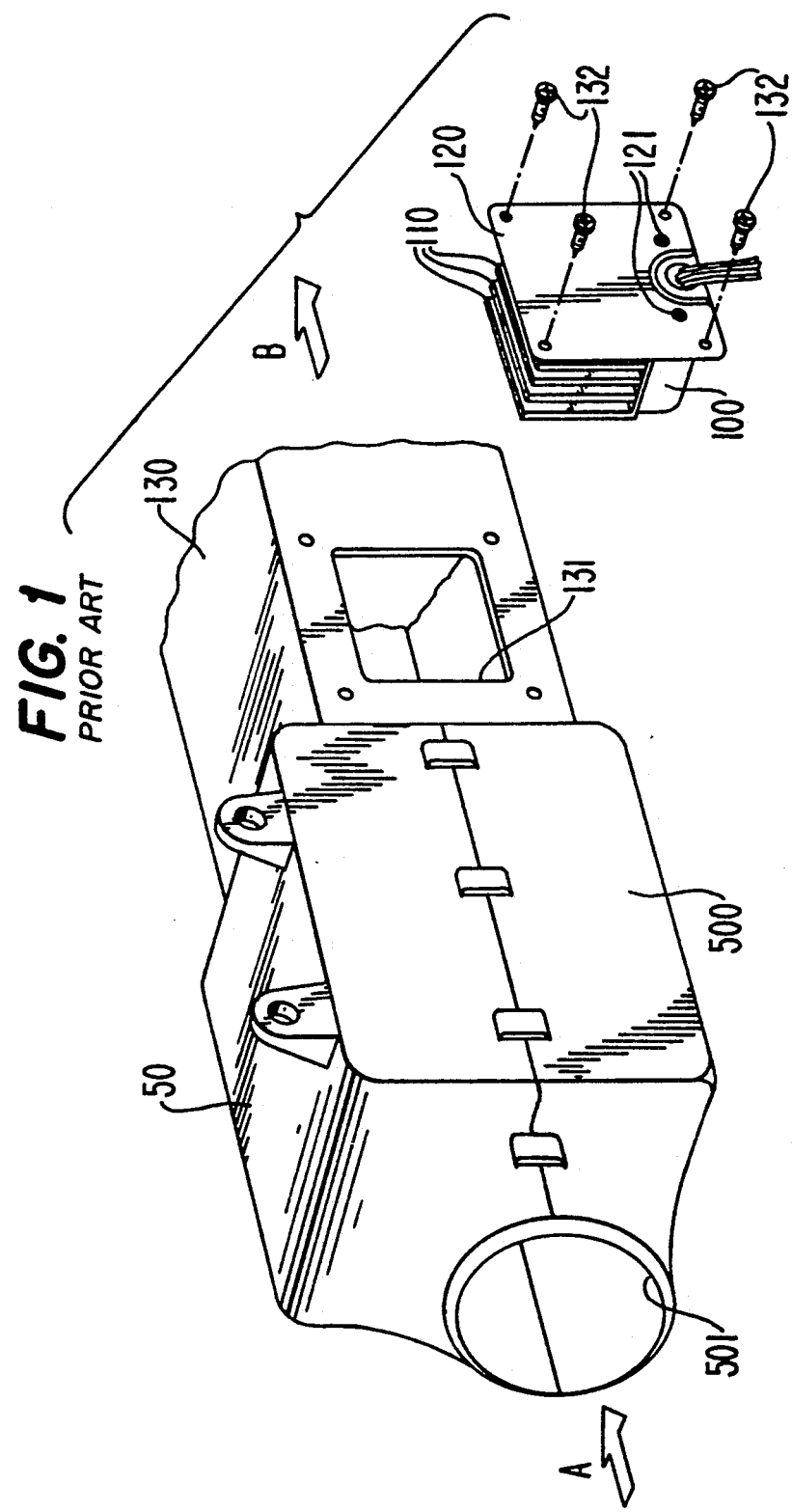
FIG. 1 is a perspective view of a certain portion of one commercial automobile air conditioning system.
Figure 2:
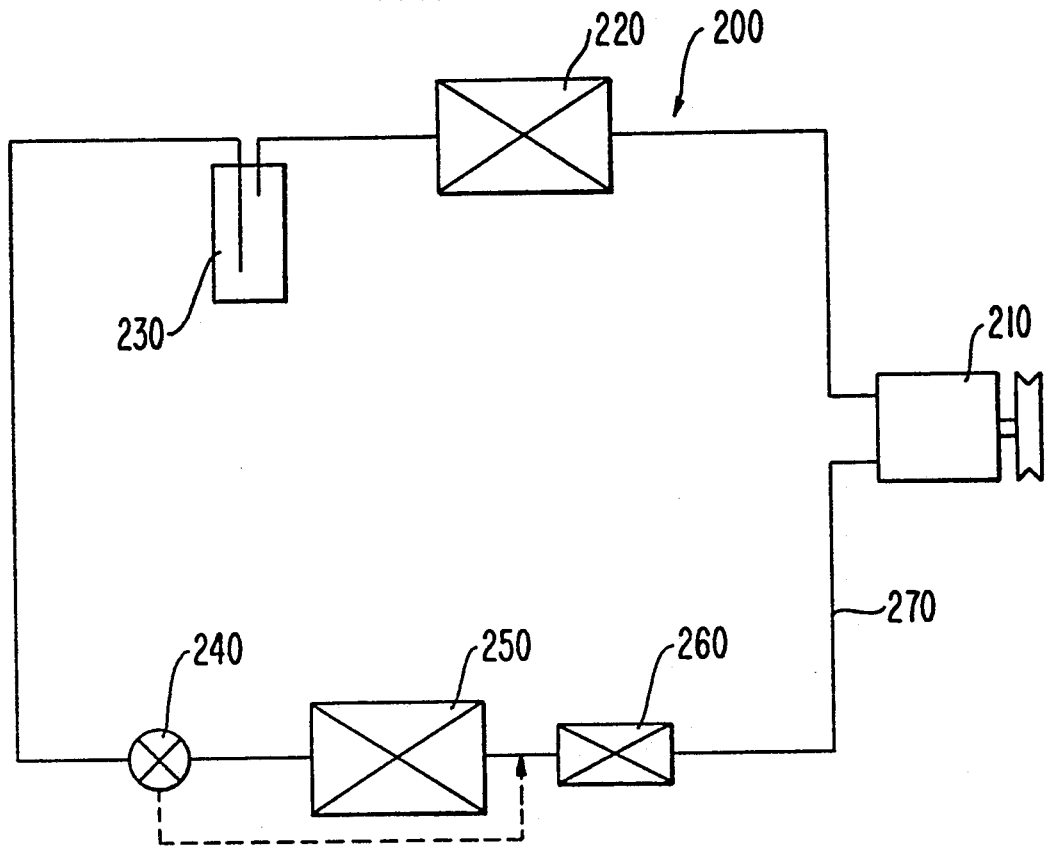
FIG. 2 is a block diagram of the refrigerant circuit of an automobile air conditioning system.
Figure 5:
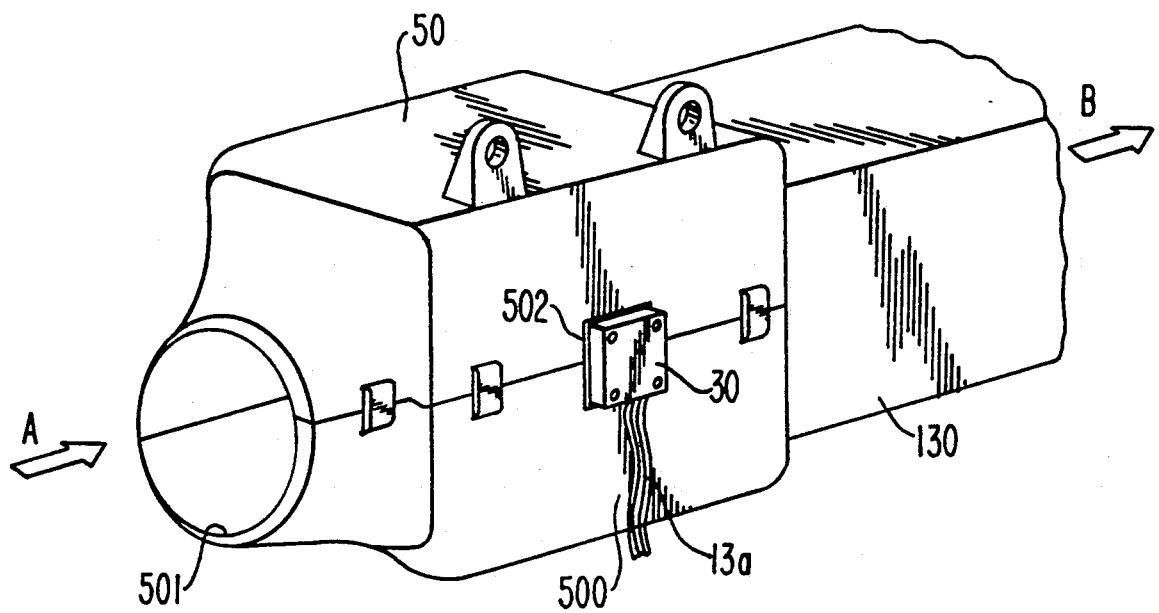
FIG. 5 is a perspective view of a cooling unit of the automobile air conditioning system in accordance with one embodiment of the present invention.

Referring to FIG. 5 in addition to FIG. 4, when evaporator 250 is accommodated in casing 500 of cooling unit 50, power transistor unit 30 protrudes from casing 500 through opening 502 formed at a side surface of casing 500 in order to facilitate ease in maintaining the power transistor.

In operation, the air outside cooling unit 50 is conducted into cooling unit 50 through opening 501 of cooling unit 50 by operation of an evaporator fan (not shown) as depicted by arrow "A". The air in cooling unit 50 is cooled while passing through heat exchange portion 25 of evaporator 250 by virtue of heat exchange with the refrigerant in flat tube 251. The cooled air subsequently flows into duct 130 to be conducted into the passage compartment as depicted by arrow "B". When the air in cooling unit 50 is heat exchanged with the refrigerant in flat tube 251, power transistor 31 is cooled by a well known manner in the art, in order to prevent an excessive rise in temperature thereof. Thus, thermal damage to power transistor 31 is prevented.

In the present invention, since the power transistor unit of the automobile air conditioning system is fixedly attached to an exterior surface of the evaporator, which is the coolest element of the refrigerant circuit, the excessive rise in temperature of the power transistor is prevented without impeding the flow of air in the duct which connects the cooling unit to the passenger compartment and without complicating the process of assembling the refrigerant circuit of the automobile air conditioning system.

While the invention has been described herein by reference to a preferred embodiment, various modifications can be made without departing from the true scope and spirit of the invention. It is intended, therefore, by the appended claims, to embody all such modifications.

I claim:

1. In an automobile air conditioning system including an electric circuit having at least one electric device and a refrigerant circuit formed by refrigerant elements such as a compressor, a condenser, an expansion element and an evaporator, wherein said evaporator is contained within a housing and wherein said housing is in turn connected to the passenger compartment of the automobile to be cooled by a duct, said electric circuit further including at least one control device associated therewith for controlling the operation of said at least one electric device to thereby control at least one of said elements of said refrigerant circuit, the improvement comprising;

said at least one control device being fixedly attached to an exterior surface of said evaporator so that heat generated by said at least one control device is conducted to said exterior surface of said evaporator which exterior surface is not direct contact with air flowing through the evaporator whereby the flow of air through the evaporator and duct to the passenger compartment is not impeded by the control device.

2. The electric circuit of claim 1 wherein said at least one control device is a power transistor.

3. The electric circuit of claim 2 wherein said at least one electric device is a motor.

4. The electric circuit of claim 3 wherein said motor drives said compressor.

5. The electric circuit of claim 4 wherein said power transistor varies the amount of electric power which is supplied to said motor so as to vary the rotational speed of said motor in response to demand.

* * * * *